(12) United States Patent
Amann

(10) Patent No.: US 6,664,571 B1
(45) Date of Patent: Dec. 16, 2003

(54) SURFACE-EMITTING DIODE RADIATION SOURCE

(75) Inventor: Markus-Christian Amann, München (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/806,260
(22) PCT Filed: Jul. 5, 1999
(86) PCT No.: PCT/DE99/02064
§ 371 (c)(1), (2), (4) Date: Jun. 21, 2001
(87) PCT Pub. No.: WO00/19545
PCT Pub. Date: Apr. 6, 2000

(30) Foreign Application Priority Data
Sep. 30, 1998 (DE) .................................... 198 44 971

(51) Int. Cl.[7] ............................................. H01L 33/00
(52) U.S. Cl. ............................. 257/79; 257/96; 257/98; 372/45
(58) Field of Search ............................. 257/79, 98, 96; 372/45

(56) References Cited

FOREIGN PATENT DOCUMENTS

| EP | 0 260 110 | 3/1988 |
|---|---|---|
| GB | 2 087 145 A | 5/1982 |
| JP | 63-216389 | 9/1988 |
| WO | 85/02722 | 6/1985 |

*Primary Examiner*—Sara Crane
(74) *Attorney, Agent, or Firm*—Fish & Richardson P.C.

(57) ABSTRACT

Surface-emitting diode emission source (1) with an active layer (10) used to create optical emissions (101, 102, 103) that is located between a confinement layer (11) consisting of semi-conductor material of a conductivity type (n) and a confinement layer (12) consisting of semi-conductor material of a conductivity type (p) opposed to the first conductivity type (n), whereby an attenuation device (20) is present to suppress the emission components (103) spreading in direction (C) parallel to the layer plane (100) of the active layer (10). Advantage: Output of emission components spreading essentially perpendicular to the layer plane is improved.

9 Claims, 3 Drawing Sheets

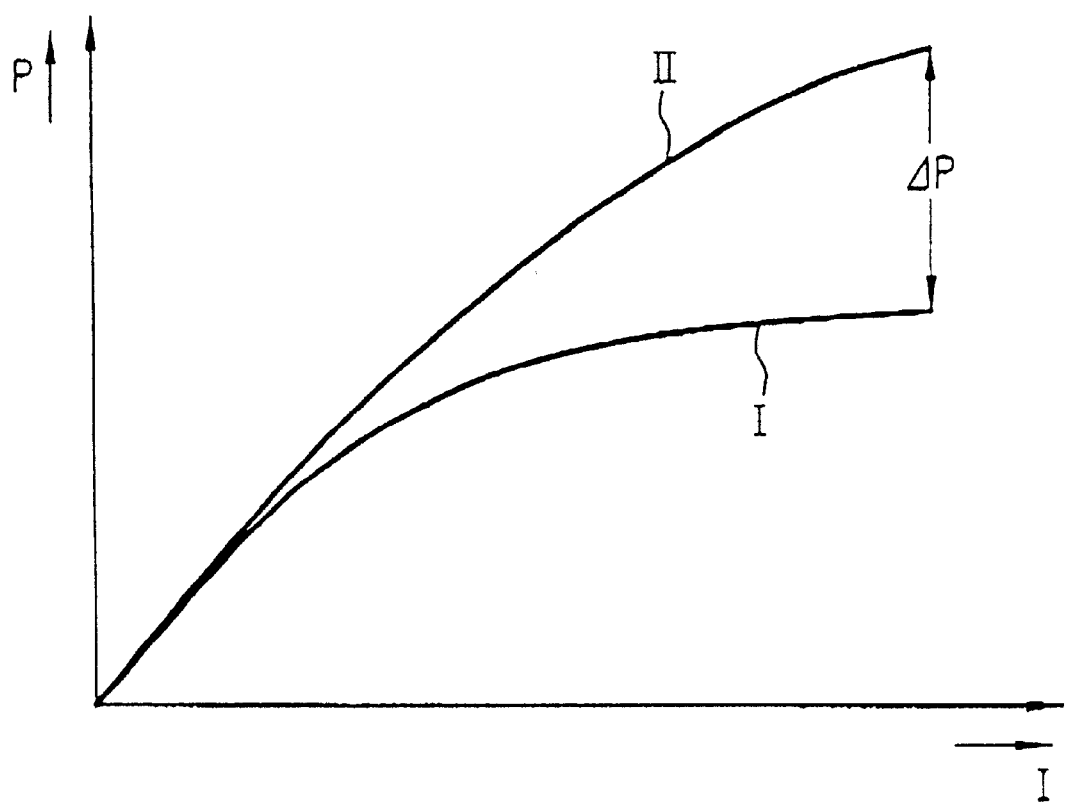

SURFACE-EMITTING DIODE RADIATION SOURCE

Figure 1:
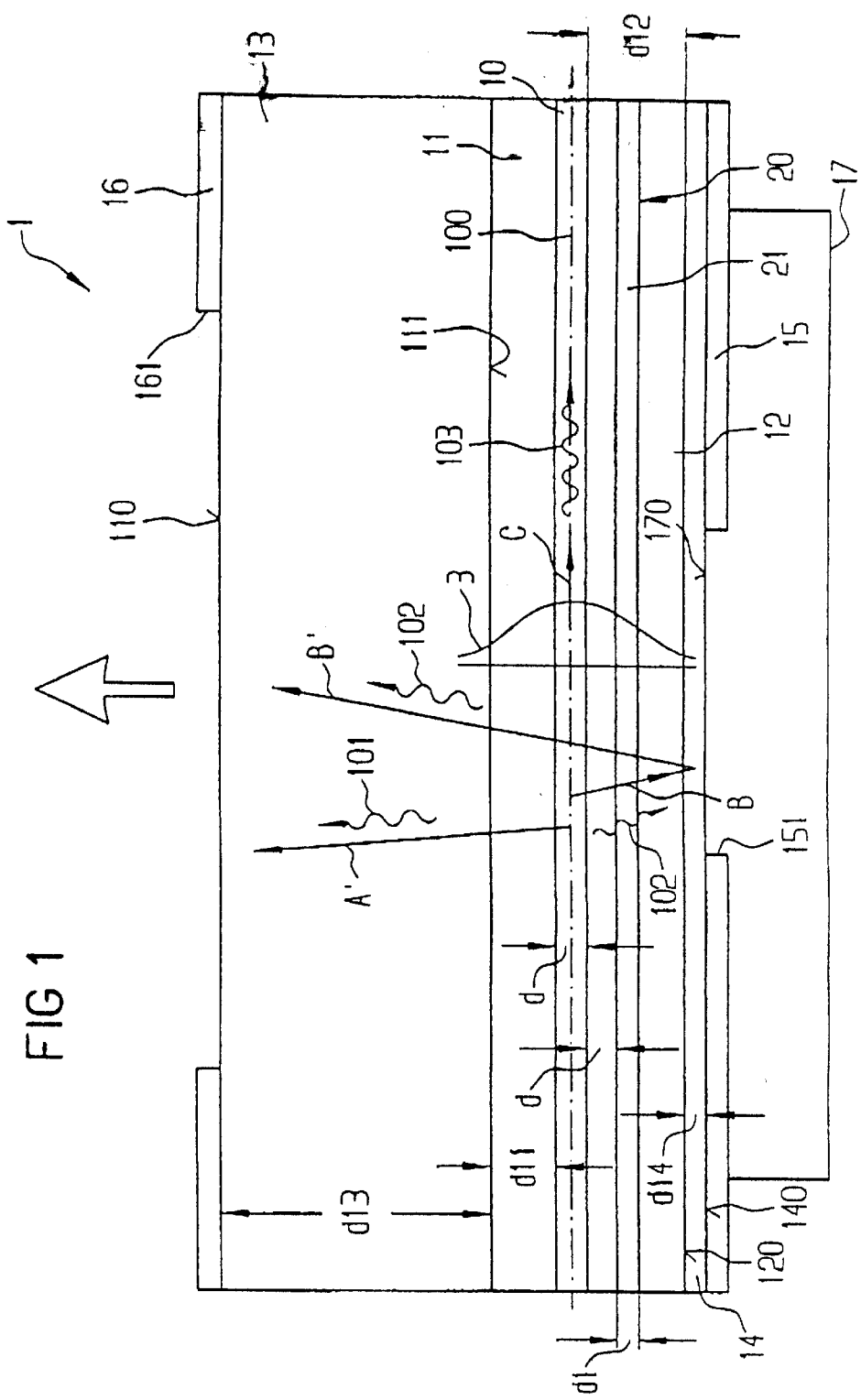

The invention relates to a surface-emitting diode emission source with an active layer used to create optical radiation whereby the created emission contains emission components spreading essentially perpendicular to a layer plane of the active layer and emission components spreading essentially parallel to this layer plane between a confinement layer consisting of semiconductor material of a conductivity type and a confinement layer consisting of semi-conductor material of a conductivity type opposed to the first conductivity type, and whereby the emission source includes a surface essentially parallel to the layer plane of the active layer from which the emission components spreading in the direction essentially perpendicular to this layer plane exit.

An example of such a surface-emitting diode emission source is a light-emitting diode (LED). LED's with high intensity and broad modulation bandwidth are usually produced using the upside-down manufacturing technique, whereby for a typical LED structure in a InGaAsP/InP material system, a confinement layer consisting of InP of conductivity type n is applied to a substrate consisting of InP of the same conductivity type n, and the other confinement layer consists of InP of the opposite conductivity type p and includes a surface facing away from the one active layer consisting of InGaAsP and the confinement layer, as well as away from the substrate, that is in flat contact with a p-contact. A surface of the substrate facing away from the confinement layers and the active layer is in contact with an n-contact that includes an opening through which this surface is exposed, and through which the emission component spreading in the direction essentially perpendicular to the layer plane of the active layer exits from the LED.

A high level of emission output for the emission component spreading in the direction essentially perpendicular to the layer plane of the active layer and exiting from the surface of the LED may only be achieved with an undoped active layer, since doping atoms enable additional non-emitting recombination processes in the active layer.

Since on the other hand the modulation bandwidth may be considerably increased by means of a high level of doping, e.g., $2 \times 10^{18}$ cm$^{-3}$, it is not possible to achieve high bandwidths and emission outputs simultaneously only by means of suitable doping.

To solve this problem for an LED, it has been recommended to use as thin an active layer as possible, e.g., to use layers with a thickness of 0.2 $\mu$m for 1.3 $\mu$m-thick LED's consisting of InGaAsP/InP within a double hetero-structure in order to increase the emitting recombination rate via high load-bearing injection without doping the layer. This method only partially solves the problem, since significantly lower emission output levels than expected result under high current conditions for the emission components spreading in the direction essentially perpendicular to the layer plane of the active level and exiting from the surface of the LED.

Another example of a surface-emitting diode emission source of the type mentioned initially is a laser diode.

For such a laser diode, a large dimension of the active layer in a direction parallel to its layer plane of about 10 $\mu$m is required to achieve a high level of emission output from the emission components spreading in the direction essentially perpendicular to the layer plane of the active level and exiting from the surface of the LED. This causes the problem that the emission is also strengthened in this direction, so that the efficiency level decreases.

For a surface-emitting laser diode, arrangement of many individual lasers into an array may achieve an increased overall output of the emission components spreading in the direction essentially perpendicular to the layer plane of the active level and exiting from the surface of the laser diode.

The invention is based on the task of pointing out how the emission output for a diode emission source of the type mentioned initially may be increased from the emission components spreading in the direction essentially perpendicular to the layer plane of the active level and exiting from the surface of the diode.

In accordance with this solution, an attenuating device is provided for this diode light source that causes attenuation of the emission components spreading in the direction essentially parallel to the layer plane of the active level.

In an advantageous embodiment example of the source based on the invention, the attenuating device includes a layer formed of emission-absorbing material within a confinement layer extending parallel to the layer plane of the active layer.

A layer of emission-absorbing material may be present on both sides of the active layer. A layer of emission-absorbing material should be arranged sufficiently close to the active layer.

The attenuating device may alternatively or additionally include adjacent emission deflection points and/or emission diffusion points in the direction parallel to the layer plane of the active layer to divert an emission portion of the emission components spreading in this parallel direction from this direction to a direction essentially perpendicular to the layer plane of the active layer.

Emission deflection points and/or emission diffusion points may be arranged in or near the active layer. By means of them, the emission components spreading in the direction parallel to the layer plane of the active layer may be diffused and attenuated. Thus, the occurrence of unfavorably strong Amplified Spontaneous Emission (ASE) may be prevented without influencing the surface emission.

An advantageous simultaneous optimization of both light output and bandwidth is produced by a source based on the invention. Moreover, the problems described above in connection with an LED or laser diode are advantageously solved whether the source based on the invention is in the form of an LED or a laser diode.

If a source based on the invention is in the form of an LED, a thin active layer may be advantageously used in order to achieve a large bandwidth, since the ASE is attenuated in the direction parallel to the layer plane of the active layer by the attenuating device.

Figure 2:
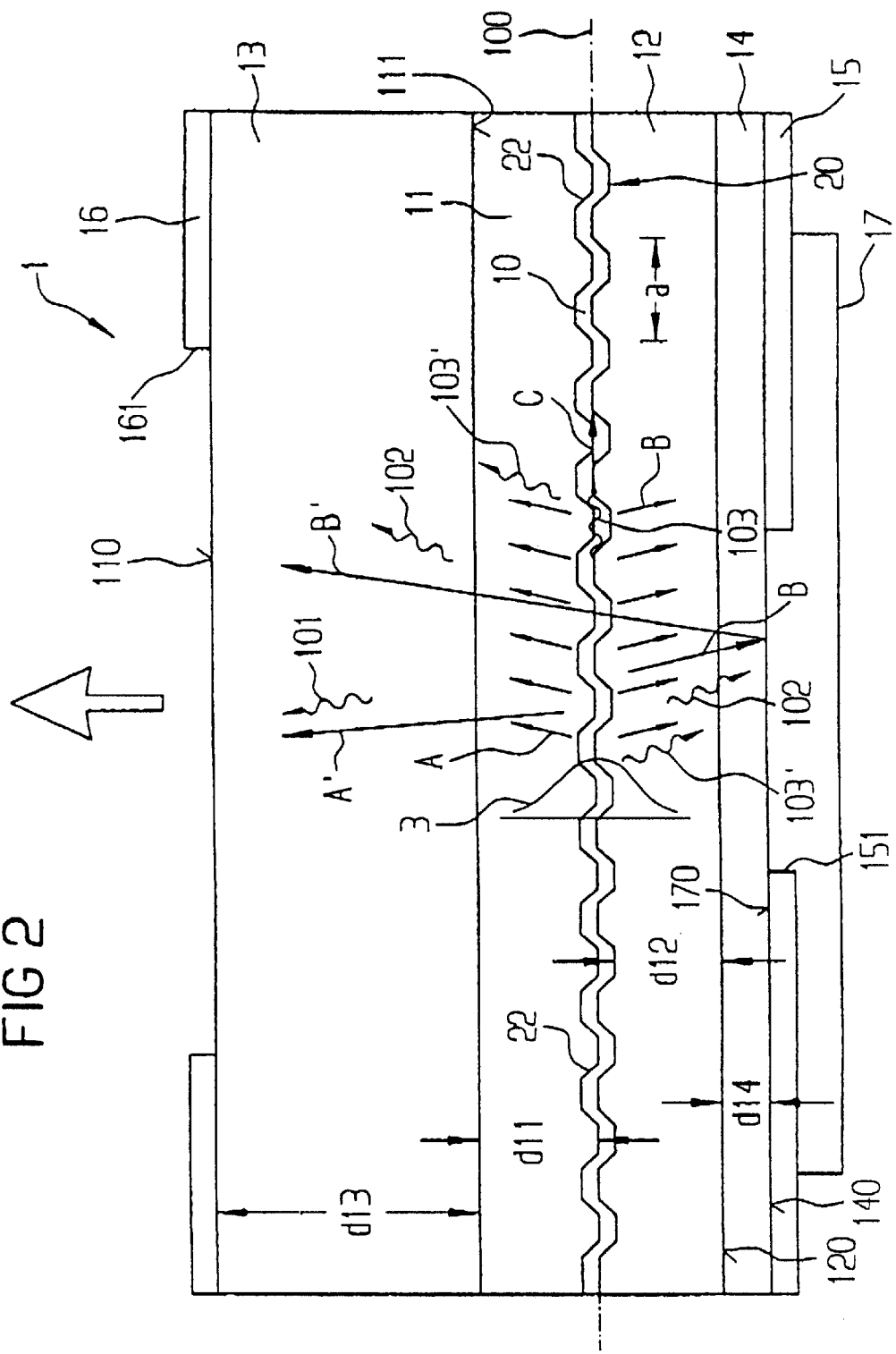

Embodiment examples of the invention are described in more detail below using illustrations:

FIG. 1 shows a cross-sectional schematic view of an embodiment example of a source based on the invention featuring a layer of emission-absorptive material perpendicular to the layer plane of the laser active layer FIG. 2 shows a cross-sectional schematic view of an embodiment example of a source based on the invention featuring diverting and/or diffusion points perpendicular to the layer plane of the laser active layer FIG. 3 shows a diagram in which is represented the emission output of the emission components spreading essentially perpendicular to the layer plane of the laser active layer and from the surface of the source based on the invention resulting from a diode current through this source, both with and without ASE.

The illustrations are not to scale.

The embodiment examples of the surface-emitting diode emission sources generally designated with the index "1"

shown in FIGS. 1 and 2 each feature an active layer 10 used to create optical emission 101, 102, 103 that is located between a confinement layer 11 consisting of n-doped semi-conductor material, for example, and a confinement layer 12 consisting in this case of p-doped semi-conductor material. In principle, the confinement layer 11 might be p-doped and the confinement layer 12 might be n-doped.

The emission 101, 102, 103 created contains an emission component 101 in the emission source 1 spreading in direction A essentially perpendicular to the layer plane 100 of the active layer 10, an emission component 102 in the emission source 1 spreading in the direction essentially opposite to direction A and perpendicular to the layer plane 100 of the active layer in direction B, and an emission component 103 parallel to the layer plane 100 in direction C.

Direction A projects from the active layer 10 toward the surface 110; direction B projects from the active layer 10 and the surface 110. Direction C is actually a double direction since the involved emission components 103 spread not only to the right as shown in FIGS. 1 and 2, but also in the opposite direction to the left.

Moreover, the emission source 1 features a surface 110 that is essentially parallel to the layer plane 100 of the active layer 10 [from] which emission component 101 exits in direction A from the source 1.

In both example cases, a substrate 13 has a surface 110 facing away from the active layer 10 and the confinement layers 11 and 12 and a surface 111 on which the confinement layer 11 is mounted that is facing away from this surface 110 but facing toward the active layer 10 and the confinement layers 11 and 12.

The substrate 13 consists of a semi-conductor material of the same conductivity type as that in the confinement layer 11, type n in this example. A layer 16 made of metal is applied to the surface 110 of the substrate 13 forming an electrical contact for the conductivity type of the substrate 13 that features an opening 161 through which the surface 110 of the substrate 13 is exposed for the exit of the emission components 101 in the direction A from the source 1 from the layer 16.

The other confinement layer 12 features, for example, a surface 120 facing away from the active layer 10 on which is applied a contact layer 14 consisting of a higher-doped semi-conductor material relative to the confinement layer 12 of the same conductivity type as that in confinement layer 12, type p in this example.

A layer 15 consisting of electrically-insulating material and featuring an opening 151 through which the surface 140 of the contact layer 14 is exposed through the layer 15, and with a contact 17 consisting of a metal for the conductivity type of the contact layer 14, type p in the example, that is in contact with the contact layer 14, is applied to a surface 140 of the contact layer 14 facing away from the active layer 10 and the confinement layer 12.

Both of these sample cases include the advantageous peculiarity that the contact 17 features a reflective surface 170 that is in contact with the surface 140 of the contact layer 14 through the opening 151 and that is facing the confinement layer 12 and the active surface 10. This surface 170 reflects the component of the emission components 102 spreading in direction B that strikes it toward direction B' and toward the active layer 10, and through this layer 10 toward the Surface 110, and then toward an exit from the source 1. The direction B', similar to direction A, is essentially perpendicular to the layer plane 100 of the active layer 10.

The source 1 features an attenuating device 20 to suppress the emission components 103 spreading in direction C parallel to the layer plane 100 of the active layer 10. By means of this measure, the unfavorable ASE along the direction C parallel to the layer plane 100 of the active layer 10 for the emission output of the emission components 101 and 102 spreading along directions A, B essentially perpendicular to the layer plane 100 of the active layer 10 can at least be reduced.

The reason for the unfavorable influence of the ASE is that optical amplification occurs as a result of the high degree of injection density required for an effective reduction of the emitting charge-carrier service life. This leads to the amplified, spontaneous emission or ASE along the direction parallel to the layer plane 100 of the active layer 10, whereby the charge-carrier density is reduced because of the stimulated emission, and the emission output P of the emission components 101, 102 spreading along directions A, B' essentially perpendicular to the layer plane 100 of the active layer 10 and emerging from the surface 110 of the source 1 is reduced in favor of an emission along direction C parallel to the layer plane 100 of the active layer 10. The ASE thereby increases more than proportionally as the diameter of the luminous spot increases. Based on calculations, up to 50% more emission output might be achieved if the ASE were prevented, depending on the structure.

In FIG. 3, the emission output P of the emission components 101, 102 spreading along directions A, B' essentially perpendicular to the layer plane 100 of the active layer 10 and emerging from the surface 110 of the source 1 is shown as a function of the diode current I flowing through the source 1 where the source 1 is in the form of a standard LED. Curve I shows the emission output P of this LED with ASE, and Curve II shows the emission output P of this LED without ASE as a function of the diode current I. ΔP is the output loss from ASE along the direction C parallel to the layer plane 100 of the active layer 10.

For the source 1 example in FIG. 1, the attenuating device 20 includes a layer 21 consisting of emission-absorptive material formed within a confinement layer and extending along direction C parallel to the layer plane 100 of the active layer 10.

For example, the layer 21 is positioned within the confinement layer 12. A separation d between the active layer 10 and the layer 21, and a thickness d1 of layer 21 are so selected that the transversal modes guided in direction C feature a high degree of confinement within this layer 21, and are thereby strongly attenuated. The local intensity distribution in the direction perpendicular to the layer plane 100 of the active layer 10 of the emission components 103 spreading along a direction C parallel to the layer plane 100 is shown by the curve 3.

If the layer 21 is positioned within the confinement layer 12, the surface emission is only affected to the extent that emission components 102 spreading in the direction B and after reflection from the surface 170 in direction B' is attenuated. The emission components 101 spreading in the direction A are not affected.

The suppression of the emission components 102 spreading in the direction B, B' may be minimized in that the thickness d1 of the layer 21 and the separation d between this layer 21 and the active layer 10 are selected to be as small as possible. i.e., a large confinement factor and a high degree of absorption along the direction C apply.

Another particularly elegant option is to so position the layer 21 between the active layer 10 and the contact layer 14 within the confinement layer 12 that a minimum caused by a standing optical wave created by the reflecting surface 170 of the contact 17 is created within the layer 21.

In a concrete embodiment of the source 1 in FIG. 1 as an LED for an emission wavelength $\lambda$ of 1.3 $\mu$m, the substrate 13 features a thickness d13 of 100 $\mu$m and consists of InP with a gap wavelength $\lambda_g$ of 0.92 $\mu$m and an n-doping of $10^{18}$ cm$^{-3}$.

The confinement layer 11 features a thickness d11 of from 1 $\mu$m to 2 $\mu$m, preferably 1 $\mu$m or 0.1 $\mu$m, and consists of InP with a gap wavelength $\lambda_g$ of 0.92 $\mu$m and an n-doping of $5\times10^{17}$ cm$^{-3}$.

The active layer 10 features a thickness d10 of from 0.1 $\mu$m to 1 $\mu$m, preferably 0.3 $\mu$m, and consists of InGaAsP with a gap wavelength $\lambda_g$ of 1.30 $\mu$m and a p-doping of from $0\times10^{18}$ cm$^{-3}$ to $2\times10^{18}$ cm$^{-3}$.

The separation d of the layer 21 from the active layer 10 is 0.1 $\mu$m to 0.3 $\mu$m, preferably 0.2 $\mu$m. The layer 21 itself features a thickness d1 of from 0.05 $\mu$m to 0.1 $\mu$m, preferably 0.1 $\mu$m or 0.05 $\mu$m.

The total thickness d12 of the confinement layer 12 containing the layer 21 measured between the active layer 10 and the contact layer 14 is from 0.65 $\mu$m to 3.4 $\mu$m, preferably 1.3 $\mu$m. The confinement layer 12 consists of InP with a gap wavelength $\lambda_g$ of 0.92 $\mu$m and a p-doping of $10^{18}$ cm$^{-3}$.

The layer 21 consists of InGaAs with a gap wavelength $\lambda_g$ of 1.67 $\mu$m and a p-doping of $2\times10^{18}$ cm$^{-3}$.

The contact layer 14 features a thickness d14 of from 0.05 $\mu$m to 0.3 $\mu$m, for example 0.1 $\mu$m, and consists of InGaAs with a gap wavelength $\lambda_g$ of 1.67 $\mu$m and a p-doping of $10^{20}$ cm$^{-3}$.

The example of a source 1 shown in FIG. 2 differs from the example shown in FIG. 1 essentially in the fact that the attenuating device 20 along direction C parallel to the layer plane 100 of the active layer 10 features adjacent emission deflection points and/or emission diffusion points 22 for the deflection of an emission component 103' of the emission components 103 spreading along this parallel direction C from this direction C into another direction A, B essentially perpendicular to the layer plane 100 of the active layer 10.

Such emission deflection points and/or emission diffusion points 22 may be arranged continuously along direction C, or, as FIG. 2 shows, with a separation a from one another sequentially. For example, the separation a may be about 10 $\mu$m.

The points 22 themselves may, for example, be produced by the positioning of non-homogenous anomalies in or near the active layer 10, and may be so formed that they have emission-reflecting or emission-diffusing properties.

A layer of emission-absorbing material such as layer 21 of the example shown in FIG. 1 is not provided for the example in FIG. 2. In this manner, the occurrence of strong ASE may be advantageously prevented without affecting the surface emissions.

The source 1 in FIG. 1 or 2 may each also be implemented in the form of a surface-emitting laser for which the suppression function 20 operates in the same manner as for an LED. Also here, one or several thin layers 21 consisting of emission-absorbing material may be positioned at minima of the vertical field distribution, for example. The minima are sharply defined because of the high reflection of Bragg reflectors in such lasers, and absorption of surface emissions may therefore be disregarded.

What is claimed is:

1. Surface-emitting emission source with an active layer used to create optical radiation that is positioned between a confinement layer consisting of semi-conductor material of conductivity type (n; p) and a confinement layer consisting of semi-conductor material of the opposite conductivity type (p; n) to the above (n; p), whereby the created emission contains emission components in the emission source spreading essentially in adirection perpendicular to a layer plane of the active layer and an emission component spreading in a direction essentially parallel to this layer plane whereby the emission source includes a surface essentially parallel to the layer plane of the active layer from which the emission components spreading in the direction essentially perpendicular to this layer plane exit, and whereby an attenuation device is present to suppress the emission components spreading in direction parallel to the layer plane of the active layer.

2. Source as in claim 1, whereby the attenuating device features a layer formed of emission-absorbing material within a confinement layer extending in a direction parallel to the layer plane of the active layer.

3. Surface-emitting emission source with an active layer used to create optical radiation that is positioned between a confinement layer consisting of semi-conductor material of conductivity type (n; p) and a confinement layer consisting of semi-conductor material of the opposite conductivity type (p; n) to the above (n; p), whereby the created emission contains emission components in the emission source spreading essentially in a direction perpendicular to a layer plane of the active layer and an emission component spreading in a direction essentially parallel to this layer plane whereby the emission source includes a surface essentially parallel to the layer plane of the active layer from which the emission components spreading in the direction essentially perpendicular to this layer plane exit, and whereby an attenuation device is present to suppress the emission components spreading in direction parallel to the layer plane of the active layer, whereby the attenuating device extending in a direction parallel to the layer plane of the active layer includes adjacent emission deflection points to divert an emission component of the emission components spreading in this parallel direction from this direction to a direction essentially perpendicular to the layer plane of the active layer.

4. Surface-emitting emission source with an active layer used to create optical radiation that is positioned between a confinement layer consisting of semi-conductor material of conductivity type (n; p) and a confinement layer consisting of semi-conductor material of the opposite conductivity type (p; n) to the above (n; p), whereby the created emission contains emission components in the emission source spreading essentially in a direction perpendicular to a layer plane of the active layer and an emission component spreading in a direction essentially parallel to this layer plane whereby the emission source includes a surface essentially parallel to the layer plane of the active layer from which the emission components spreading in the direction essentially perpendicular to this layer plane exit, and whereby an attenuation device is present to suppress the emission components spreading in direction parallel to the layer plane of the active layer, whereby the attenuating device in the direction parallel to the layer plane of the active layer includes adjacent emission diffusion points to divert an emission component of the emission components spreading in this parallel direction from this direction to a direction essentially perpendicular to the layer plane of the active layer.

5. Surface-emitting emission source with an active layer used to create optical radiation that is positioned between a confinement layer consisting of semi-conductor material of conductivity type (n; p) and a confinement layer consisting of semi-conductor material of the opposite conductivity type (p; n) to the above (n; p), whereby the created emission contains emission components in the emission source spreading essentially in a direction perpendicular to a layer plane of the active layer and an emission component spreading in a direction essentially parallel to this layer plane whereby the emission source includes a surface essentially parallel to the layer plane of the active layer from which the emission components spreading in the direction essentially perpendicular to this layer plane exit, and whereby an attenuation device is present to suppress the emission components spreading in direction parallel to the layer plane of the active layer, whereby the attenuating device features a layer formed of emission-absorbing material within a confinement extending in a direction parallel to the layer plane of the active layer, whereby the attenuating device extending in a direction parallel to the layer plane of the active layer includes adjacent emission deflection points to divert an emission component of the emission components spreading in this parallel direction from this direction to a direction essentially perpendicular to the layer plane of the active layer.

6. Surface-emitting emission source with an active layer used to create optical radiation that is positioned between a confinement layer consisting of semi-conductor material of conductivity type (n; p) and a confinement layer consisting of semi-conductor material of the opposite conductivity type (p; n) to the above (n; p), whereby the created emission contains emission components in the emission source spreading essentially in a direction perpendicular to a layer plane of the active layer and an emission component spreading in a direction essentially parallel to this layer plane whereby the emission source includes a surface essentially parallel to the layer plane of the active layer from which the emission components spreading in the direction essentially perpendicular to this layer plane exit, and whereby an attenuation device is present to suppress the emission components spreading in direction parallel to the layer plane of the active layer, whereby the attenuating device features a layer formed of emission-absorbing material within a confinement extending in a direction parallel to the layer plane of the active layer, whereby the attenuating device in the direction parallel to the layer plane of the active layer includes adjacent emission diffusion points to divert an emission component of the emission components spreading in this parallel direction from this direction to a direction essentially perpendicular to the layer plane of the active layer.

7. Source as in claim 3, whereby the attenuating device in the direction parallel to the layer plane of the active layer includes adjacent emission diffusion points to divert an emission component of the emission components spreading in this parallel direction from this direction to a direction essentially perpendicular to the layer plane of the active layer.

8. The source as in claim 1 wherein said confinement layer is an optical confinement layer.

9. The source as in claim 1 wherein said attenuation device is a continuous layer.

* * * * *